United States Patent [19]

St. Clair

[11] 4,231,104
[45] Oct. 28, 1980

[54] GENERATING TIMING SIGNALS

[75] Inventor: Richard P. St. Clair, Simi Valley, Calif.

[73] Assignee: Teradyne, Inc., Boston, Mass.

[21] Appl. No.: 900,189

[22] Filed: Apr. 26, 1978

[51] Int. Cl.³ .......................... G06F 1/04; G06M 3/02
[52] U.S. Cl. ............................... 364/900; 235/92 PE
[58] Field of Search ... 364/200 MS File, 900 MS File; 235/92 DM, 92 PE, 92 DP

[56] References Cited
U.S. PATENT DOCUMENTS

| | | | |
|---|---|---|---|
| 3,478,325 | 11/1969 | Oeters | 364/900 |
| 3,581,066 | 5/1971 | Maure et al. | 235/92 PE |
| 4,053,739 | 10/1977 | Miller et al. | 235/92 DM X |
| 4,063,308 | 12/1977 | Collins et al. | 364/200 |
| 4,084,082 | 4/1978 | Alfke | 235/92 DM |

*Primary Examiner*—Raulfe B. Zache

[57] ABSTRACT

A signal generator featuring, in one aspect, a clock, a programmable means for counting signals from the clock and providing outputs at predetermined counts, a delay means for providing a timing signal after a predetermined delay following each output, the delay means having a resolution higher than that of the clock, and a programmable means for repeatedly incrementing the delay for successive timing signals to provide a timing signal period not necessarily an integer multiple of the period of the clock. Preferred embodiments feature an additional delay means for delaying the output of the clock to provide sequences of clock signals having the same period as the clock output but shifted in time so that each timing signal occurs simultaneously with a clock signal, an additional counter connected to be clocked by the clock signals and reset by the timing signals, and means controlled through the counter for generating timing edges with a resolution equal to that of the delay means.

14 Claims, 3 Drawing Figures

GENERATING TIMING SIGNALS

BACKGROUND OF THE INVENTION

This invention relates to generating timing signals.

Stable clocks such as crystal oscillators have been used to generate a sequence of timing signals of variable signal-to-signal interval by programming digital counters to trigger the timing signals at predetermined counts of the clock. Although tapped delay lines having resolution (e.g., 1 nanosecond) higher than that (e.g., 16 ns) of the clock have been used to additionally delay signals relative to the start of the sequence, timing signal interval resolution has in such systems been limited by the clock resolution, with the timing signal period equal to the crystal oscillator period or an integer multiple thereof.

SUMMARY OF THE INVENTION

My invention provides a simple, low cost, highly accurate, timing signal generator in which the period of timing signals derived from a fixed period clock can be asynchronous with (i.e., not equal to or an integer multiple of) the clock period and can be programmably varied on an interval by interval basis with resolution higher than that of the clock.

In general, my invention features, in one aspect, a clock and programmable counter combination whose output is fed through a variable delay to produce the timing signal, and programmable means for repeatedly changing the delay for successive signals.

In preferred embodiments the delay means is a tapped delay line which has a resolution at least ten times that of the clock.

In other preferred embodiments a second programmed delay line phase shifts the basic clock to provide a derived clock signal of the same period as the basic clock but shifted in time so that a clock signal occurs simultaneously with each timing signal.

In another aspect of the invention such derived clock and timing signals are in turn used to respectively advance and reset a further programmed counter to provide timing edges capable of controlling a pulse generator. The generator provides a train of pulses the length and spacing of which can be programmed pulse by pulse with resolution higher than that of the basic clock.

DESCRIPTION OF THE PREFERRED EMBODIMENT

We turn now to the circuitry and operation of a preferred embodiment of the invention, after first briefly describing the drawings.

DRAWINGS

CIRCUITRY

Figure 1:
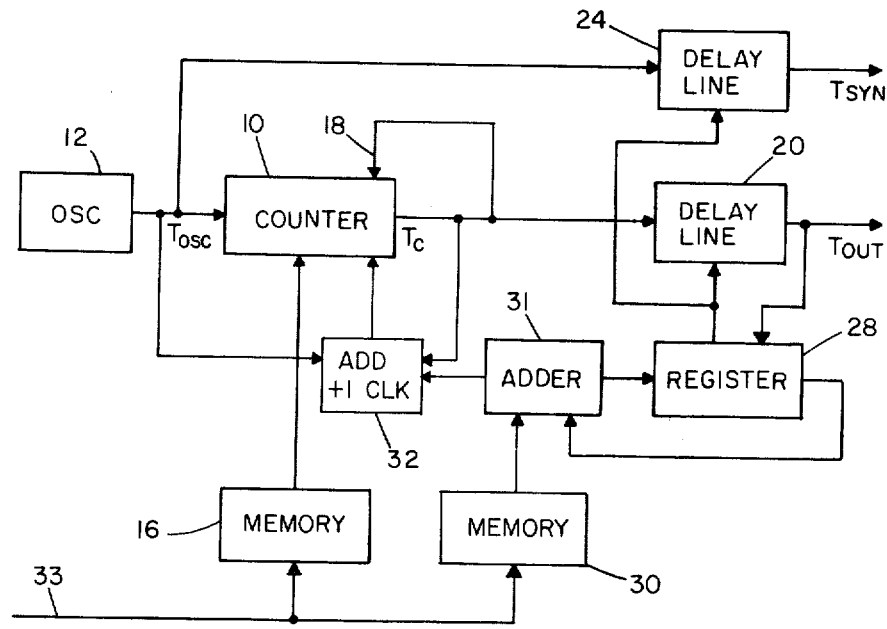
FIG. 1 is a block diagram of a circuit for deriving clock and timing signals from a crystal oscillator signal.

Referring to FIG. 1, 8 bit presettable counter 10 is arranged to count the output signals $T_{OSC}$ of 16 nsec period crystal oscillator 12, and, at counts determined by numbers loaded into the counter from memory 16 (an 8 bit wide by 16 word RAM), provide pulses $T_C$ to delay line 20. $T_C$ is also fed back to preset input 18 of the counter. Oscillator 12 also provides $T_{OSC}$ signals directly to delay line 24. Delay lines 20 and 24 each have 1 nsec resolution and 15 nsec total delay capacity, and are commonly controlled by a delay time number stored in 4 bit register 28 to respectively provide timing signals $T_{OUT}$ and clock signals $T_{SYN}$.

Memory 30 (a 4 bit wide by 16 word RAM) stores delay change numbers to increment register 28 for successive $T_{OUT}$s. Four bit adder 31 adds the numbers stored in memory 30 and register 28, and each $T_{OUT}$ causes the sum to be introduced into the register. Add +1 circuit 32 (a register clocked by $T_{OSC}$ and $T_C$) is provided to receive a carry from adder 31 when the capacity (15) of register 28 is exceded, and, upon receipt of the carry, to inhibit counter 10 for one count.

Input 33 is connected to a computer to load the count and delay change numbers into memories 16 and 30 and to select which numbers appear at the memory outputs at any given time.

Figure 2:
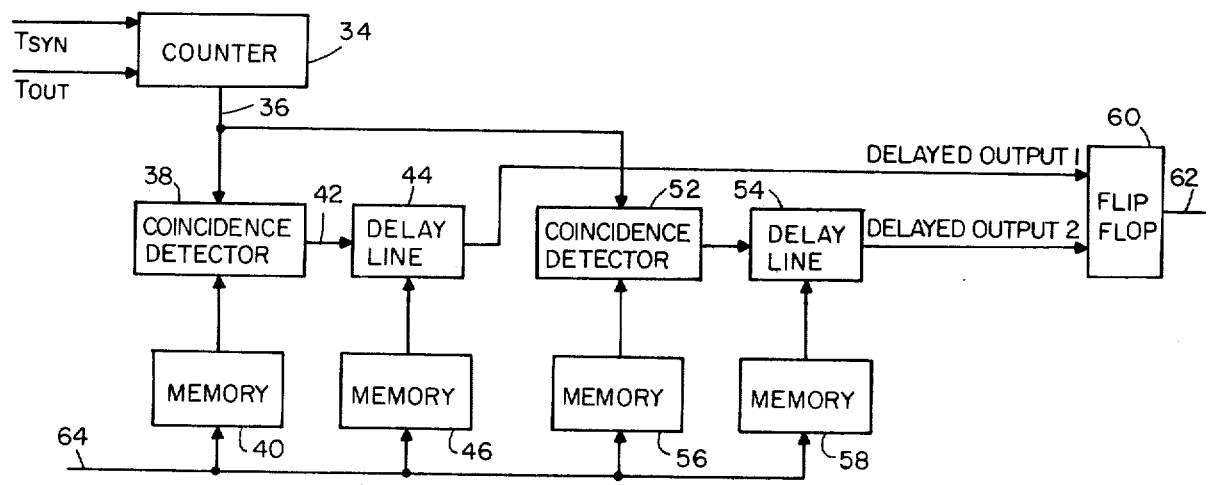
FIG. 2 is a block diagram of a circuit for using the derived clock and timing signals from FIG. 1 to generate timing edge signals to control a pulse generator.

Referring to FIG. 2, 8 bit counter 34 is arranged to count $T_{SYN}$ pulses and to be reset by $T_{OUT}$. Eight bit coincidence detector 38 provides a pulse at output 42 when the accumulated count at counter output 36 equals a number stored in memory 40 (an 8 bit wide by 16 word RAM). Output 42 is delayed in 1 nsec resolution delay line 44 for up to 15 nsec, as selected by a delay time number stored in memory 46 (a 4 bit wide by 16 word RAM), to provide a first timing edge signal, Delayed Output 1. A second timing edge signal, Delayed Output 2, is similarly provided by 8 bit coincidence detector 52, 0-15 nsec delay line 54, memory 56, and memory 58. Delayed Outputs 1 and 2 are applied to the set and reset inputs of flip-flop 60 to generate a train of pulses at output 62. Input 64 from a computer loads and controls memories 40, 46, 56 and 58.

OPERATION

Figure 3:
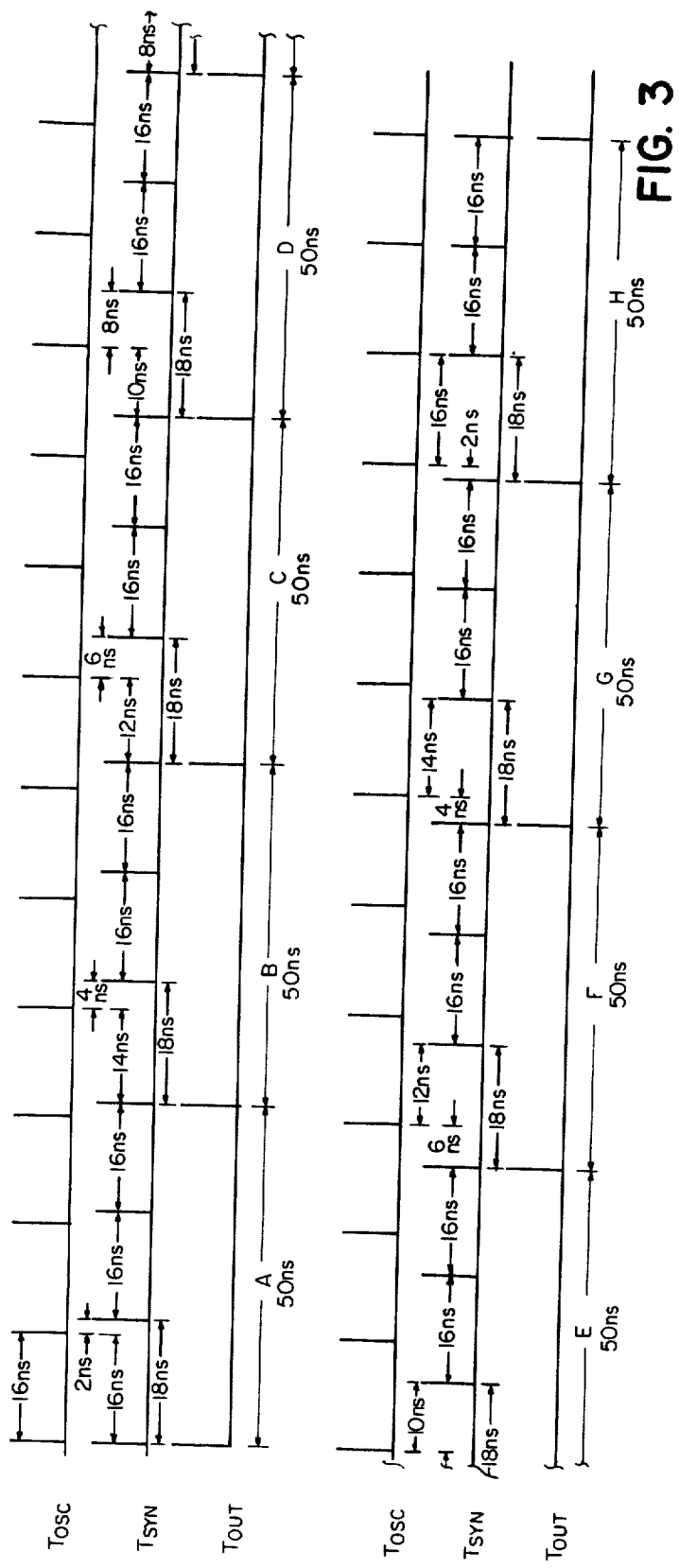
FIG. 3 is a timing diagram illustrating the operation of FIG. 1.

FIG. 3 illustrates the use of the circuit of FIG. 1 to generate a timing signal $T_{OUT}$ having a 50 nsec period for eight such periods, A–H. Preceding period A, $T_{OUT}$, $T_{SYN}$, and $T_{OSC}$ are coincident (i.e., the delays imposed on $T_C$ and $T_{OSC}$ were zero). $T_{OUTA}$ is to occur 50 nsec (three 16 nsec $T_{OSC}$ periods plus 2 nsec) after this coincidence, so that the count number 3 (loaded in advance in memory 16) is loaded into counter 10 by the $T_C$ pulse occurring at the coincidence. The delay change number 2 (loaded in advance in memory 30) is added to the delay time number 0 in register 28, by adder 31, and the sum (2) is loaded into register 28 by the $T_{OUT}$ at the coincidence to select delays of 2 nsec for delay lines 20 and 24. Counter 10 counts down from 3 by one count with each $T_{OSC}$ input and, after 3 $T_{OSC}$ clocks (3×16=48 nsec), reaches zero and generates a $T_C$, which in turn is delayed by 2 nsec in delay line 20 to provide $T_{OUTA}$. The first $T_{SYN}$ in period A occurs 18 nsec (the 16 nsec period of $T_{OSC}$ plus 2 nsec delay in delay line 24) from the start of period A, and is followed by two more $T_{SYN}$s at 16 nsec intervals. I.e., each $T_{SYN}$ is delayed by 2 nsec from its corresponding $T_{OSC}$, so that the last $T_{SYN}$ of period A will be coincident with $T_{OUTA}$.

$T_{OUTB}$ is to occur 50 nsec (3 $T_{OSC}$ periods plus 2 nsec) after $T_{OUTA}$ and, because counter 10 begins a new counting operation with the start of each $T_{OUT}$ period, the count number 3 is again loaded into the counter from memory 16 by $T_C$. The delay imposed on $T_{OSC}$ and $T_C$ must be increased by 2 nsec, to 4 nsec, for $T_{OUTB}$ to occur at the desired time relative to $T_{OUTA}$, i.e., 6 counted $T_{OSC}$ periods (96 nsec) plus 4 nsec of delay (a total of 100 nsec) from the start of period A. The sum 4 already present in adder 31 is loaded into register 28 by $T_{OUTA}$ to select delays of 4 nsec for delay lines 20 and 24. Counter 10 and the delay lines then generate a sequence of three $T_{SYN}$ clocks at 16 nsec intervals, with the first occurring 18 nsec (14+4) after $T_{OUTA}$, and with the last such $T_{SYN}$ (50 nsec after $T_{OUTA}$) being coincident with $T_{OUTB}$.

Counter 10, memory 16, and delay lines 20 and 24 operate in the same manner in periods C through G to generate successive $T_{OUT}$ timing signals and $T_{SYN}$ clock signals. The number 3 is loaded into the counter in each period and the delay imposed on $T_C$ and $T_{OSC}$ increases by 2 nsec for each succeeding period, so that, while the first $T_{SYN}$ of each period is always 18 nsec after the preceding $T_{OUT}$ and the last $T_{SYN}$ is coincident with $T_{OUT}$, both $T_{SYN}$ and $T_{OUT}$ shift in time relative to $T_{OSC}$ by an amount which approaches one full $T_{OSC}$ period.

For period H, the accumulated delay time required becomes 16 nsec (i.e., one $T_{OSC}$ period), which exceeds the capacity of delay lines 20 and 24, the register, and the adder. When adder 31 adds 2 to the delay number for period G (14), causing the sum to become 16, the adder generates a carry output which is fed to add+1 circuit 32, and feeds an output of zero to register 28. The carry output inhibits the counting of counter 10 for one count, and the inhibited $T_{OSC}$ clears circuit 32 so that counter 10 resumes counting. The $T_{SYN}$ and $T_{OUT}$ of period H are therefore once again coincident with $T_{OSC}$, and the time relationship between $T_{OUT}$, $T_{SYN}$, and $T_{OSC}$ is as it was at the start of period A.

If the $T_{OUT}$ period is selected to be, e.g., 53 nsec, the count number loaded into register 10 is again 3, but the delay imposed on $T_C$ and $T_{OSC}$ by delay lines 20 and 24 is 5 nsec in the first period and increases by 5 nsec with each succeeding period. After 3 periods, the accumulated delay is 15 nsec, and for the fourth period, when the dealy required is 20 nsec, the adder generates a carry output to the add+1 circuit, to inhibit one count, and the delay line delays go to 4 nsec (i.e., the excess of 20 nsec over 16 nsec). In the next period 5 nsec is added to the 4 nsec, giving a 9 nsec delay, and so on.

Nonuniform $T_{OUT}$ periods can be generated by appropriate selection of the count numbers stored in memory 16 and the delay change numbers stored in memory 30. E.g., for successive $T_{OUT}$ periods of 50 nsec, 69 nsec, and 28 nsec, the count and delay change numbers would be (assuming the $T_{OUT}$ period sequence began with $T_{OUT}$, $T_{SYN}$, and $T_{OSC}$ coincident in time):

| $T_{OUT}$ Period | Count Number | Delay Number | Delay Change Number |
|---|---|---|---|
| 50 nsec | 3 | 2 nsec | 2 |
| 69 nsec | 4 | 7 nsec | +5 |
| 28 nsec | 2 | 3 nsec | −4 | so that $T_{OUT}$ would occur at 50 nsec (3 counts+2 nsec), 119 nsec (7 counts+7 nsec), and 147 nsec (9 counts+3 nsec) after the start of the sequence.

FIG. 2 illustrates use of $T_{OUT}$ and $T_{SYN}$ to generate timing edge signals and a train of pulses of selectable spacing and width. $T_{SYN}$ clocks counter 34 to provide Delayed Output 1 (which sets flip-flop 60 to begin the pulse appearing at output 62) and Delayed Output 2 (which resets the flip-flop to terminate the pulse). $T_{OUT}$, which is always coincident with a $T_{SYN}$, resets counter 34 to zero each time the counting for a given pulse is completed, so that counter 34 may begin counting for the next pulse.

The times of occurrence of Delayed Outputs 1 and 2 can be selected, within any counting cycle of counter 34 (i.e., within a $T_{OUT}$ period), in increments of 1 nsec, the resolution of delay lines 44 and 54. By controlling $T_{SYN}$ and $T_{OUT}$ on a cycle to cycle basis (i.e., shifting them in time relative to $T_{SYN}$ and $T_{OUT}$ of the preceding cycle), the timing between successive counting cycles can also be selected in increments of 1 nsec (the resolution of delay lines 20 and 24), so that, by coordinating the numbers stored in memories 16, 30, 40, 46, 56, and 58, both the width and the spacing of the pulses appearing at output 62 can be programmed in 1 nsec increments.

The time interval between the edge signal terminating one pulse (Delayed Output 2) and that starting the next pulse (Delayed Output 1) can be selected to be as little as 1 nsec, so that the limiting factor in determing the minimum interval between pulses is the response time of the circuitry driven by Delayed Outputs 1 and 2. If flip-flop 60 is a high speed integrated circuit, e.g., of the 74LS00 family, this limit is about 5 nsec. Shorter intervals can be achieved by the triangulation method, i.e., simultaneously (with the time interval between Delayed Output 2 terminating one pulse and Delayed Output 1 starting the next pulse programmed to be zero) setting and resetting the flip-flop with the output pulse width determined by the difference in propagation time of these signals through the flip-flop (about 1 nsec). Where more complex pulse-forming circuits are used, Delayed Outputs 1 and 2 can be further delayed by equal amounts, preserving their mutual timing, to provide the actual pulse forming-timing edges while undelayed Delayed Output 1 and 2 signals are used to pretrigger the pulseforming circuitry, in preparation for the actual timing edges.

The amount of storage in the memories is dependent upon the timing resolution required, and the number of different pulse widths and intervals desired, and should be sufficient to contain the program for the entire sequence of pulses to be generated.

Other embodiments are within the following claims. E.g., $T_{OUT}$ as generated in FIG. 1 could be used as a reset signal for an analog ramp generator; a pair of level detectors would provide beginning and ending timing edges to a pulse generator, at selected ramp levels, and $T_{OUT}$ would determine the interval between pulses.

I claim:
1. A signal generator, comprising
   a clock for generating clock signals separated in time by a clock period,
   programmable counting means for counting said clock signals and providing outputs at predetermined counts,
     said outputs being separated in time by an integer multiple of said clock period,
   delay means for providing a timing signal after a delay interval following each said output,
     the resolution of said delay means being greater than that of said clock, and
   programmable delay means for repeatedly changing said delay interval for successive said timing signals so that said timing signals are separated in time by other than integer multiples of the period of said clock.

2. The generator of claim 1 wherein the resolution of said delay means is at least ten times that of said clock.

3. The generator of claim 2 wherein the resolution of said delay means is at least as high as 1 nsec.

4. The generator of claim 1 wherein said delay means has a total delay capacity no greater than the duration of one clock interval, and said programmable delay means comprises means for effectively inhibiting said counting means for one count, a digital register for controlling the delay in said delay means, an adder for incrementing the desired delay value and correspondingly adjusting said register after each said timing pulse, and for activating said inhibiting means and resetting said register when said value corresponds to said duration of one clock interval, and a programmable element for controlling said adder.

5. The generator of claim 4 wherein said delay means comprises a tapped delay line.

6. The generator of any of the preceding claims further comprising additional delay means for delaying the output of said clock to provide sequences of clock signals having the same period as said clock output but shifted in time so that each said timing signal occurs simultaneously with a said clock signal.

7. The generator of claim 6 wherein said programmable means is connected to provide equal delays in said delay means and said additional delay means.

8. The generator of claim 6 further comprising an additional counter connected to be clocked by said clock signals and reset by said timing signals, and means controlled through said counter for generating timing edges with a resolution equal to that of said delay means.

9. A signal generator comprising
   a clock, means for deriving from said clock a sequence of timing signals having a period other than an integer multiple of the period of said clock, means for deriving from said clock a train of clock signals having the same period as said clock but shifted in time so that each said timing signal occurs simultaneously with a said clock signal, a counter connected to be clocked by said clock signals and reset by said timing signals, and means controlled through said counter for generating timing edges.

10. The generator of claim 9 wherein said means for generating timing edges comprises first programmable means for generating a first timing edge after said counter reaches a first count, and second programmable means for generating a second timing edge after said counter reaches a second count prior to being reset by a said timing signal.

11. The generator of claim 10 wherein each said programmable means comprises a first portion having a resolution equal to that of said counter, and a second portion including delay means having a resolution higher than that of said counter.

12. The generator of claim 11 wherein each said programmable means comprises means for programming its respective first portion and its respective delay means.

13. The generator of any of claims 9–12 wherein the resolution of said clock signals and said timing signals is at least as high as 1 nsec.

14. The generator of claim 13 wherein said means for deriving said clock signals comprises means for delaying the output of said clock by a selected multiple of a resolution unit no longer than 1 nsec; and said means for deriving said timing signals comprises a programmable counter responsive to said clock to provide an output at a predetermined count, and means for delaying said counter output by a selected multiple of said resolution unit.

* * * * *